US009818941B2

United States Patent
Min

(10) Patent No.: US 9,818,941 B2
(45) Date of Patent: Nov. 14, 2017

(54) ORGANIC LIGHT EMITTING DIODE DISPLAY AND MANUFACTURING METHOD THEREOF

(71) Applicant: Samsung Display Co., Ltd., Yongin-si (KR)

(72) Inventor: Kyoung Wook Min, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/962,459

(22) Filed: Dec. 8, 2015

(65) Prior Publication Data

US 2016/0372670 A1    Dec. 22, 2016

(30) Foreign Application Priority Data

Jun. 16, 2015 (KR) .................. 10-2015-0085182

(51) Int. Cl.
  *H01L 51/00* (2006.01)
  *H01L 51/56* (2006.01)
  *H01L 27/32* (2006.01)

(52) U.S. Cl.
  CPC ...... *H01L 51/0014* (2013.01); *H01L 27/3246* (2013.01); *H01L 51/0005* (2013.01); *H01L 51/56* (2013.01); *H01L 2227/323* (2013.01)

(58) Field of Classification Search
  CPC ............ H01L 51/0014; H01L 27/3246; H01L 51/0005; H01L 51/56; H01L 2227/323
  See application file for complete search history.

(56) References Cited

U.S. PATENT DOCUMENTS

| 8,124,172 | B2 | 2/2012 | Lang et al. | |
| 9,112,177 | B2 | 8/2015 | Shim et al. | |
| 2003/0201716 | A1* | 10/2003 | Yamazaki | H01L 27/322 313/506 |
| 2007/0069637 | A1 | 3/2007 | Jang et al. | |
| 2014/0145979 | A1* | 5/2014 | Lee | G06F 3/0412 345/173 |
| 2015/0001485 | A1 | 1/2015 | Kang | |
| 2016/0312354 | A1* | 10/2016 | Ko | C23C 14/042 |
| 2016/0365390 | A1* | 12/2016 | Hsu | H01L 27/3211 |

FOREIGN PATENT DOCUMENTS

| KR | 1020070035734 | 4/2007 |
| KR | 1020140115840 | 10/2014 |
| KR | 1020150003567 | 1/2015 |

* cited by examiner

*Primary Examiner* — Fernando L Toledo
*Assistant Examiner* — Neil Prasad
(74) *Attorney, Agent, or Firm* — H.C. Park & Associates, PLC

(57) ABSTRACT

An organic light emitting diode display including: a plurality of pixel electrodes disposed on a substrate; a pixel defining layer disposed on the pixel electrodes and including a plurality of openings exposing the respective pixel electrodes; a plurality of organic emission layers disposed on the respective pixel electrodes; and intermediate pattern layers respectively disposed between the pixel electrodes and the organic emission layers. The intermediate pattern layers include a plurality of first patterns that are extended while being respectively connected along the openings neighboring along a predetermined path.

15 Claims, 15 Drawing Sheets

ORGANIC LIGHT EMITTING DIODE DISPLAY AND MANUFACTURING METHOD THEREOF

CROSS-REFERENCE TO RELATED APPLICATION

This application claims priority from and the benefit of Korean Patent Application No. 10-2015-0085182, filed on Jun. 16, 2015, which is hereby incorporated by reference for all purposes as if fully set forth herein.

BACKGROUND

Field

Exemplary embodiments relate to an organic light emitting diode display and a manufacturing method thereof.

Discussion of the Background

Because an organic light emitting diode (OLED) display has a self-luminance characteristic and does not require a separate light source, unlike a liquid crystal display, and has several desirable operational characteristics, such as low power consumption, high luminance, and a high response speed, OLED devices have received attention as a next-generation display device.

In general, a screen printing method, a photosensitive paste method using a photolithography process, and an ink-jet printing method are used to form an organic emission layer for such an organic light emitting diode display, and the ink-jet printing method has received attention because a print pattern can be formed for a large-sized substrate.

More specifically, the ink-jet printing method is a method in which attaching ink in a desired pattern by spraying ink from a nozzle through pressure of an organic material is used for forming an organic emission layer on the substrate However, such an ink-jet printing method has a problem in adjusting the amount of ink for each nozzle, and thus, organic emission layers formed by attaching organic ink on a substrate may exhibit significant thickness deviation, such that, in a process for forming organic emission layers in a large-sized substrate, the duration of time for drying an organic emission layer formed in an initial processing stage and the duration of time for drying an organic emission layer formed in the last processing stage are different from each other, thereby producing a defective surface in the light emission layer. Further, the thickness deviations in the patterns and the differences in the durations of time for drying causes non-uniformity in luminance of the organic light emitting diode display, thereby causing a reduction in display quality.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting diode display in which the uniformity of the thickness of organic emission layers can be significantly improved by including an intermediate pattern layer, and which can assure excellent luminance uniformity by assuring a similar drying speed even if the organic emission layers are formed using an inkjet printing method, along with a manufacturing method thereof.

Additional aspects will be set forth in the detailed description which follows, and, in part, will be apparent from the disclosure, or may be learned by practice of the inventive concept.

An exemplary embodiment of the present invention discloses: a plurality of pixel electrodes disposed on a substrate; a pixel defining layer disposed on the pixel electrodes and including a plurality of openings respectively exposing the pixel electrodes; a plurality of organic emission layers respectively disposed on the pixel electrodes; and intermediate pattern layers respectively disposed between the pixel electrodes and the organic emission layers. The intermediate pattern layers include a plurality of first patterns that are extended while being respectively connected along the openings neighboring along a predetermined path.

An exemplary embodiment also discloses a method of manufacturing an organic light emitting diode display, including: forming a plurality of pixel electrodes on a substrate; forming a pixel defining layer including a plurality of openings that respectively expose the plurality of pixel electrodes on the plurality of pixel electrodes; forming an intermediate pattern layer including a plurality of first patterns that are extended while being connected along the plurality of openings that neighbor each other along a predetermined path using a photolithography process on a substrate where the plurality of pixel defining layers is formed; and forming a plurality of organic emission layers on the plurality of first patterns using an inkjet printing method, wherein the forming of the intermediate pattern layer is performed to make the respective corresponding pixel electrode portions of the first patterns, disposed to respectively correspond to the plurality of pixel electrodes, have the same height.

The organic light emitting diode display according to the exemplary embodiment of the present invention can significantly improve the uniformity of the thickness of organic emission layers, and can assure excellent luminance uniformity because time required for drying each organic emission layer is similar to one another, even if the organic emission layers are formed using an inkjet printing method.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
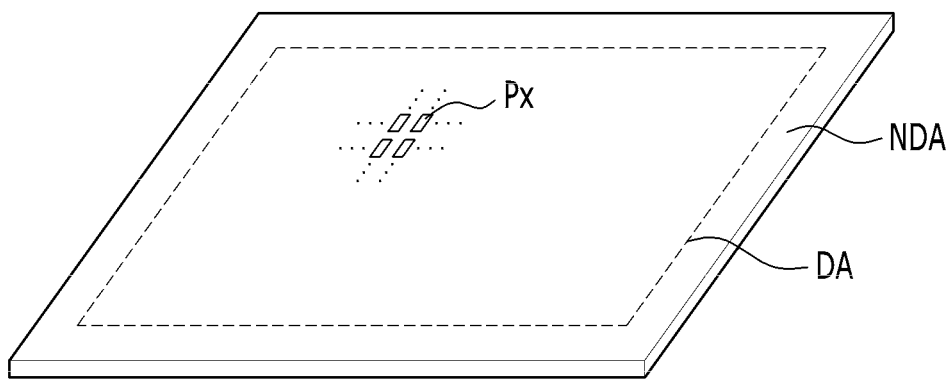
FIG. 1 is a perspective view of an organic light emitting diode display according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
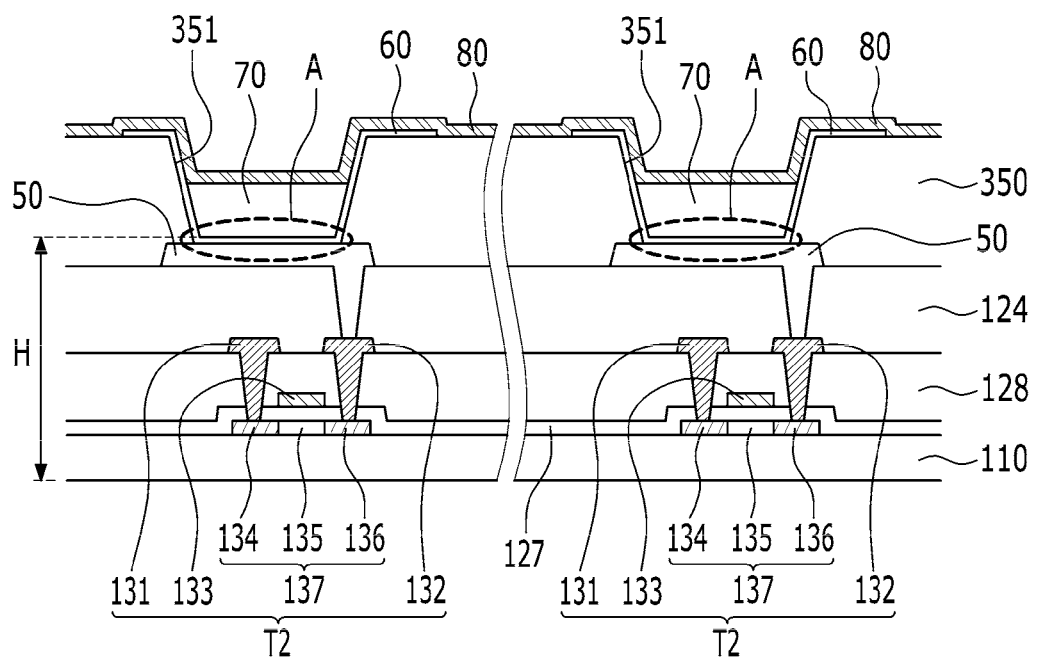
FIG. 2, FIG. 3, and FIG. 4 are cross-sectional views of the organic light emitting diode display according to an exemplary embodiment of the present invention.

FIG. 1 is a perspective view of an organic light emitting diode display according to an exemplary embodiment of the present invention, and FIG. 2 is a cross-sectional view of the organic light emitting diode display according to an exemplary embodiment of the present invention.

Referring to FIG. 1 and FIG. 2, an organic light emitting diode display includes a substrate 110, a driving thin film transistor T2, a pixel electrode 50, a pixel defining layer 350, an organic emission layer 70, an intermediate pattern layer 60, and a common electrode 80.

A plurality of pixel electrodes 50 and the common electrodes 80 may be disposed, and one of the pixel electrode 50 and the common electrode 80 may be an anode serving as a hole injection electrode, and the other one of the pixel electrode 50 and the common electrode 80 may be a cathode serving as an electron injection electrode.

The substrate 110 may include a display area DA displaying an image and a non-display area NDA surrounding the display area DA. The substrate 110 may be made of a rigid material, such as glass, metal, or synthetic resin, or may be made of a flexible material, such as polyimide (PI), polyethyleneterephthalate (PET), and the like. That is, in the present exemplary embodiment, the substrate 110 may be made of various materials, rather than being limited to a specific type, characteristic, or material.

A buffer layer (not shown) may be disposed on the substrate 110. The buffer layer prevents permeation of impure elements and provides a flat surface.

The buffer layer may be made of various materials that can provide the above-stated functions. For example, one of a silicon nitride (SiN) layer, a silicon oxide ($SiO_2$) layer, and silicon oxynitride ($SiO_xN_y$) layer may be used as the buffer layer. However, the buffer layer is not required, and may be omitted according to a type or a process condition of the substrate 110.

A driving semiconductor layer 137 is then formed on the buffer layer. The driving semiconductor layer 137 may be made of a material including polysilicon. Further, the driving semiconductor layer 137 includes a channel region 135 in which impurities are not doped, and a source region 134 and a drain region 136 in which the impurities are doped at both sides of the channel region 135. In this case, the doped ion materials are P-type impurities, such as boron (B), and $B_2H_6$ is mainly used. Here, the impurities vary according to the type of thin film transistor used.

A gate insulating layer 127 made of a silicon nitride ($SiN_x$) or a silicon oxide ($SiO_x$) is formed on the driving semiconductor layer 137. A gate wire, including a driving gate electrode 133, is formed on the gate insulating layer 127. In addition, the driving gate electrode 133 is formed to overlap at least a part of the driving semiconductor layer 137, particularly the channel region 135.

An interlayer insulating layer 128 covering the driving gate electrode 133 is formed on the gate insulating layer 127. A first contact hole and a second contact hole that expose the source area 134 and the drain area 136 of the driving semiconductor 137 are formed in the gate insulating layer 127 and the interlayer insulating layer 128. Like the gate insulating layer 127, the interlayer insulating layer 128 may be made of a material such as a silicon nitride ($SiN_x$) or a silicon oxide ($SiO_x$).

In addition, a data wire including a driving source electrode 131 and a driving drain electrode 132 may be disposed on the interlayer insulating layer 128. Further, the driving source electrode 131 and the driving drain electrode 132 are respectively connected to the source area 134 and the drain area 136 of the driving semiconductor layer 137 through the first contact hole and the second contact hole respectively formed in the interlayer insulating layer 128 and the gate insulating layer 127.

As described, the driving thin film transistor 130, including the driving semiconductor layer 137, the driving gate electrode 133, the driving source electrode 131, and the driving drain electrode T2, is formed. The configuration of the driving thin film transistor T2 is not limited to the aforementioned example, and may be variously modified as a known configuration which may be easily implemented by those skilled in the art.

A planarization layer 124 covering the data wire is formed on the interlayer insulating layer 128. The planarization layer 124 serves to remove and planarize a step in order to increase emission efficiency of the organic light emitting element to be formed thereon. Further, the planarization layer 124 has a third contact hole exposing a part of the drain electrode 132.

Here, the structure of the organic light emitting diode display according to the exemplary embodiment of the present invention is not limited to the aforementioned structure, and in some cases, one of the planarization layer 124 and the interlayer insulating layer 128 may be omitted.

The pixel electrodes 50 of the organic light emitting diode are disposed on the planarization layer 124, and the pixel electrode 50 may operate the organic light emitting diode display by receiving an electric signal and transmitting electrons or holes to the organic emission layer 70 in the present exemplary embodiment.

Thus, the organic light emitting diode display according to an exemplary embodiment of the present invention includes the plurality of pixel electrodes 50, each disposed in each pixel Px. In this case, the pixel electrodes 50 are separated from each other. Further, each of the pixel electrodes 50 are connected with a drain electrode 132 through the third contact hole of the planarization layer 124.

Pixel defining layers 350, where openings that expose pixel electrodes 50 are respectively formed, are disposed on the planarization layer 124

The openings are formed between the pixel defining layers 350 respectively corresponding to the plurality of pixels Px. That is, the openings of the pixel defining layers 350 that expose the pixel electrodes 50 may define areas of the respective pixels Px.

The pixel electrodes 50 are arranged to correspond to the respective openings of the pixel defining layers 350. However, the pixel electrode 50 may be disposed below the pixel defining layer 350 such that the pixel electrode 50 may partially overlap the pixel defining layer 350, as shown in FIG. 2, rather than being disposed only in the opening of the pixel defining layer 350.

The organic emission layers 70 are disposed on the pixel electrodes 50, and intermediate pattern layers 60 are disposed respectively between the pixel electrodes 50 and the organic emission layers 70. The structure of the intermediate pattern layer 60 and the structure of the organic emission layer 70 will be described in detail later.

A common electrode 80 may be disposed on the organic emission layer 70. As such, an organic light emitting diode (OLED), including the pixel electrode 50, the intermediate pattern layer 60, the organic emission layer 70, and the common electrode 80, is formed.

The pixel electrode 50 and the common electrode 80 may be made of a transparent conductive material or a transflective or reflective conductive material. Further, according to the type of material that forms the pixel electrode 50 and the common electrode 80, the organic light emitting diode display may be a top emission type, a bottom emission type, or a double-sided emission type.

An encapsulation layer (not shown) may be further disposed on the common electrode 80. The encapsulation layer may prevent permeation of moisture and/or oxygen from the outside by encapsulating the organic light emitting diode. The upper surface of the encapsulation layer may be a flat surface. The encapsulation layer may include a plurality of thin film layers and, for example, may have a multi-layered structure including at least one of an inorganic layer and an organic layer.

Figure 3:
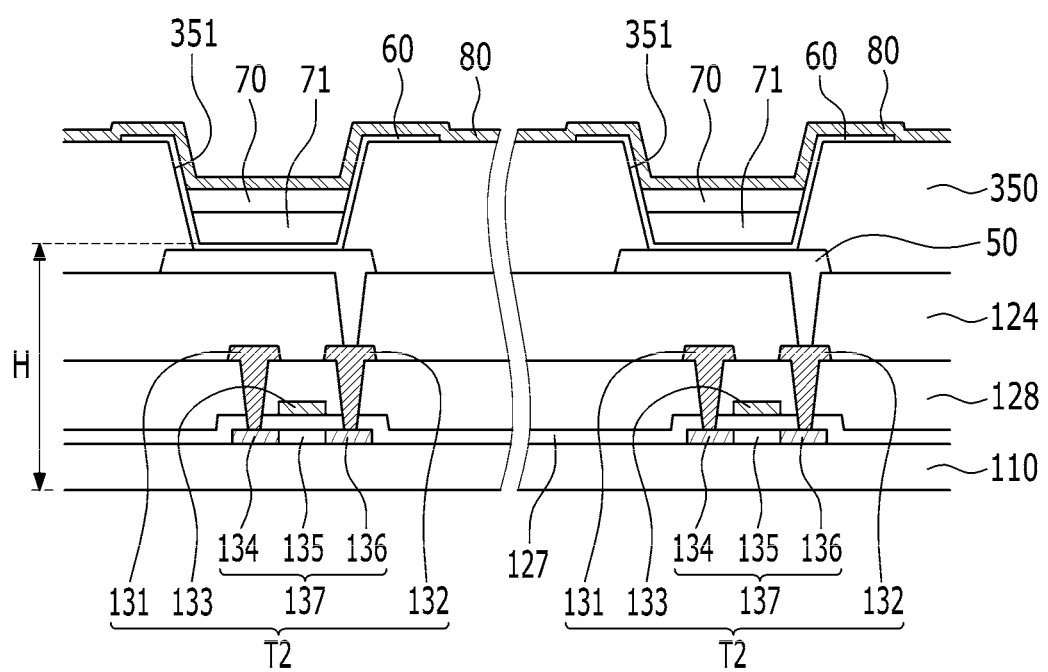
Figure 4:
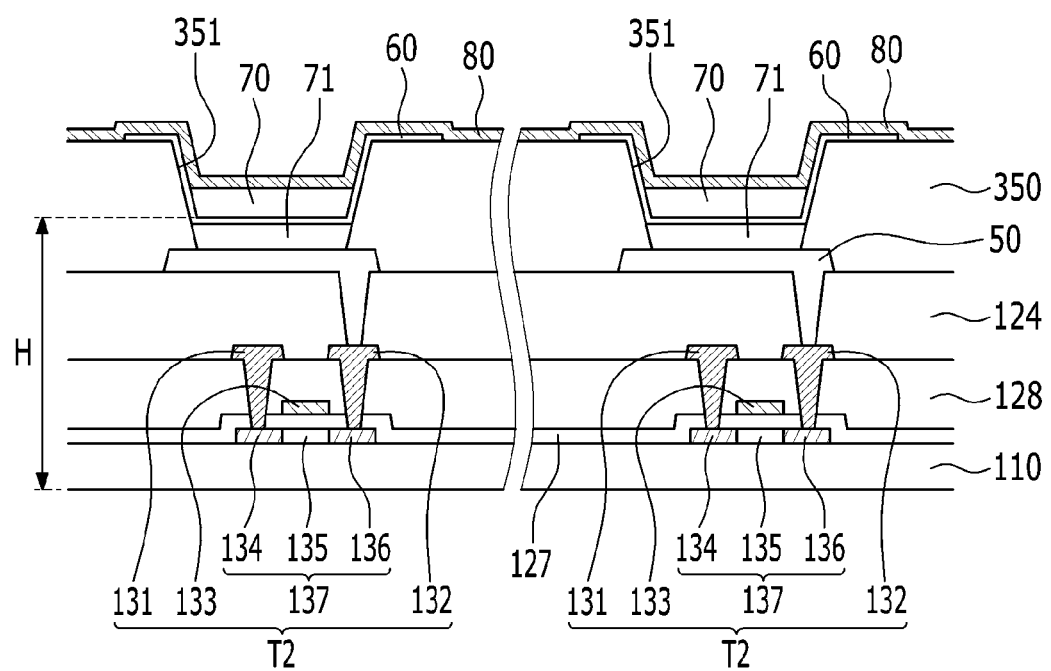

FIG. 3 and FIG. 4 illustrate cross-sectional views of the organic light emitting diode display according to an exemplary embodiment of the present invention. Hereinafter, the organic emission layer 70 according to various exemplary embodiments of the present invention will be described with reference to FIG. 3 and FIG. 4, together with FIG. 2, and a vertical cross-sectional structure of the intermediate pattern layer 60 according to the various exemplary embodiments of the organic emission layer 70 will be described.

In the present exemplary embodiment, the organic emission layer 70 is formed on the pixel electrode 50, and the intermediate pattern layer 60 is disposed between the pixel electrode 50 and the organic emission layer 70.

First, the organic emission layer 70 may be made of a low-molecular material or a high-molecular material, such as PEDOT (Poly 3,4-ethylenedioxythiophene).

The organic emission layer 70 according to the present exemplary embodiment may include a primary emission layer. The primary emission layer may be at least one of a red organic emission layer emitting a red color, a green organic emission layer emitting a green color, and a blue organic emission layer emitting a blue color, and the red organic emission layer, the green organic emission layer, and the blue organic emission layer form a red pixel, a green pixel, and a blue pixel, respectively, thereby implementing a color image.

The organic emission layer 70 may have a multi-layered structure that further includes one or more organic layers, such as an electron transporting layer (ETL), an electron injection layer (EIL), and the like, formed above the organic emission layer 70 adjacent to the common electrode 80, that is, above and in addition to the primary emission layer.

Next, as shown in FIG. 3 and FIG. 4, the organic emission layer 70 may further include an auxiliary organic layer 71 disposed in a lower portion of the organic emission layer 70, which is adjacent to the pixel electrode 50.

In this case, the auxiliary organic layer 71 may have a multi-layered structure in which one or more layers among a hole injection layer (HIL) and a hole transporting layer (HTL) are sequentially layered.

In the organic light emitting diode display according to the exemplary embodiment of the present invention, as shown in FIG. 2, the intermediate pattern layer 60 may be disposed between the pixel electrode 50 and the organic emission layer 70.

Selectively, as shown in FIG. 3, the intermediate pattern layer 60 may be formed between the pixel electrode 50 and the auxiliary organic layer 71, and as shown in FIG. 4, the intermediate pattern layer 60 may be formed between the auxiliary organic layer 71 and the organic emission layer 70. Alternatively, although it is not illustrated, the intermediate pattern layer 60 may be disposed between respective layers of the auxiliary organic layer 71 of the above-stated multi-layered structure. Thus, in the present exemplary embodiment, the intermediate pattern layer 60 may be disposed between respective layers of the organic layer having a multi-layered structure formed through an ink jet printing process, and the location or the intermediate pattern layer 60 is not necessarily limited in a vertical cross-sectional view.

FIG. 5 to FIG. 8 respectively illustrate top plan views of the organic light emitting diode displays according to an exemplary embodiment of the present invention. Hereinafter, referring to FIG. 5 to FIG. 8, together with FIG. 2, a horizontal cross-section shape of the intermediate pattern layer 60 according to various exemplary embodiments of the present invention will be described.

In the display area DA of the substrate 110, an opening in the pixel defining layer 350, exposing the pixel electrode 50, defines each pixel Px area. The organic emission layer 70 may be disposed on the pixel electrode 50, and therefore, each pixel Px area corresponds to each opening.

Such a plurality of openings, i.e., the respective pixel Px areas, may be formed in a straight line, a curved line, etc.

Figure 5:
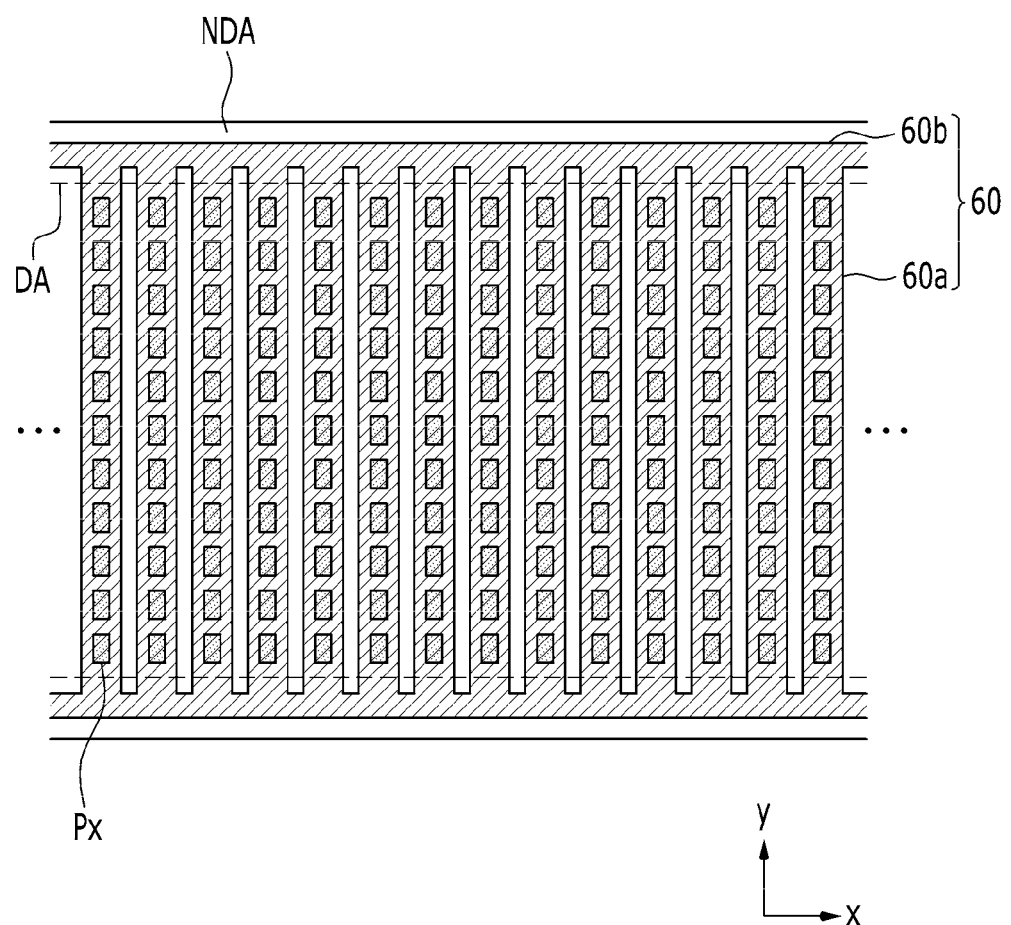
FIG. 5, FIG. 6, FIG. 7, and FIG. 8 are top plan views of the organic light emitting diode display according to an exemplary embodiment of the present invention.
Figure 6:
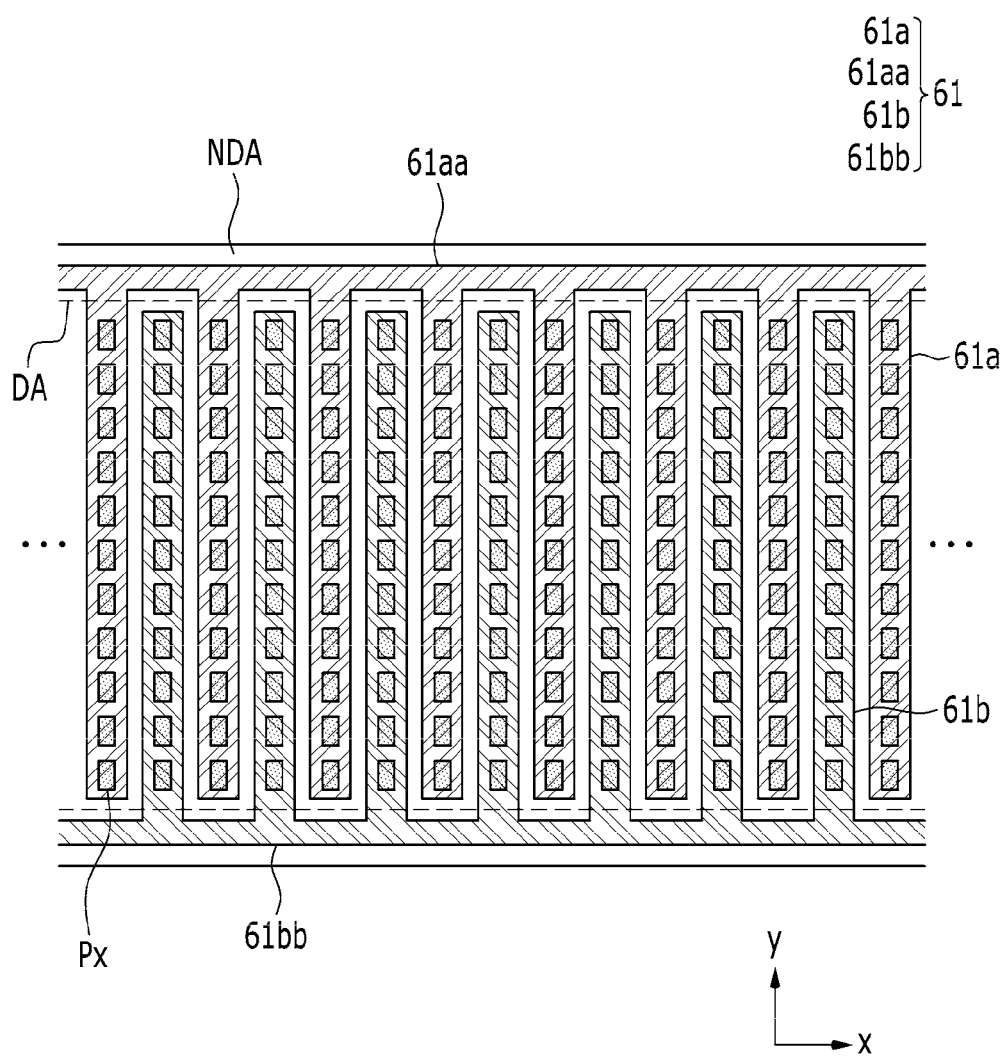
Figure 7:
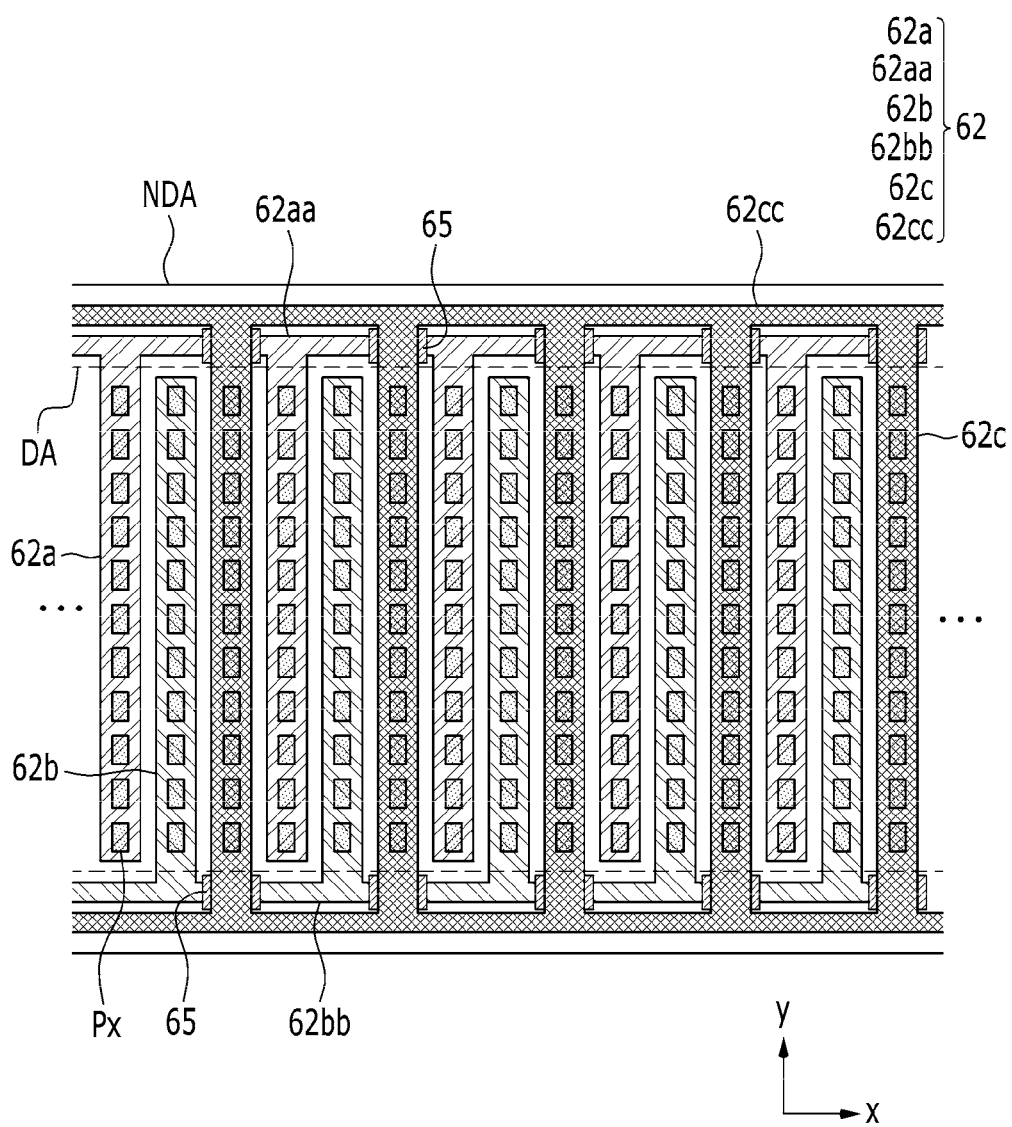

Referring to FIG. 5 to FIG. 7, the respective pixel Px areas refined by the plurality of openings may be aligned in a row along a first direction (i.e., x-axis direction) and a second direction (i.e., y-axis) that crosses the first direction in the display area DA of the substrate 110.

Here, in FIG. 5 to FIG. 7, the first direction and the second direction perpendicularly cross each other, but the respective pixels Px may be arranged in a zigzag pattern rather than being linearly arranged in one of the first and second directions.

Figure 8:
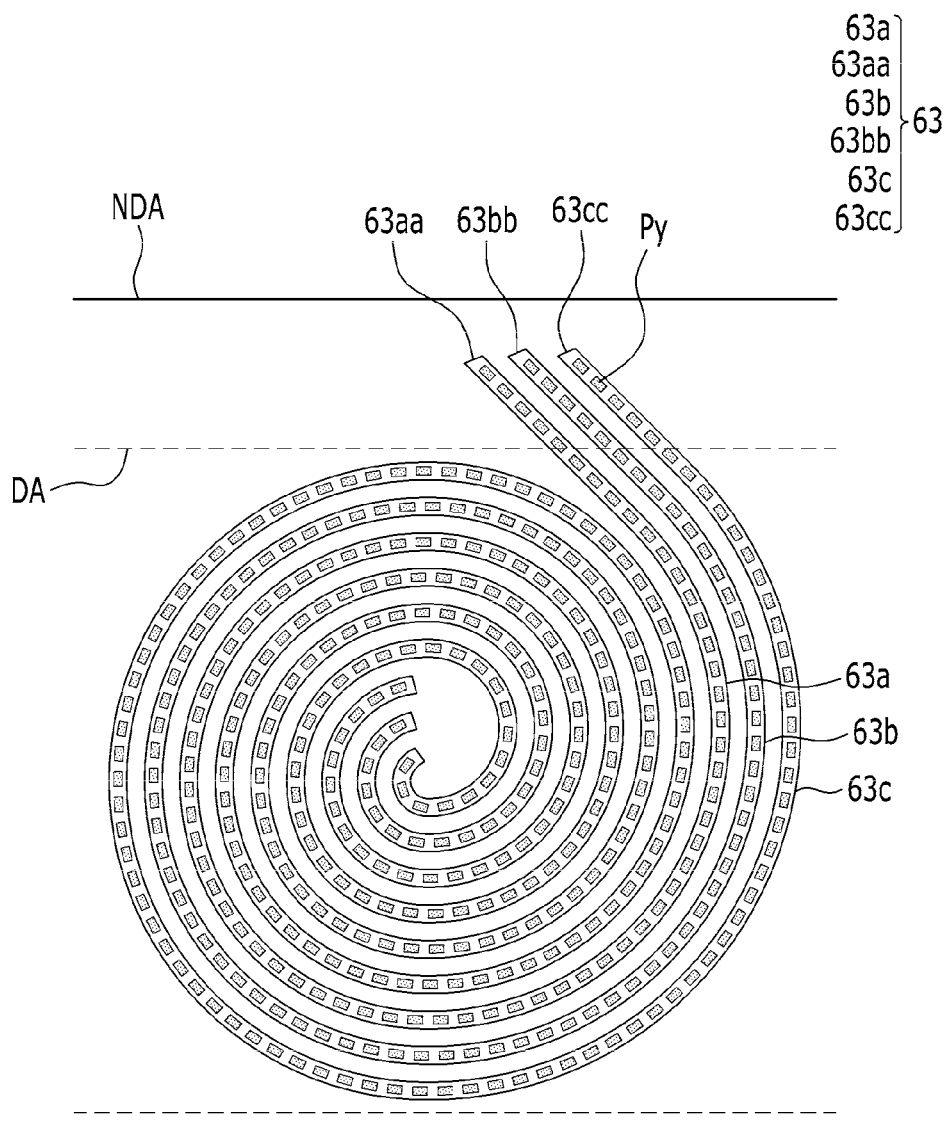

Further, referring to FIG. 8, the respective pixels Px defined by the plurality of openings may be separated from each other with a constant gap on a spirally curved line in the display area DA of the substrate 110. In this case, the respective pixel Px may be disposed at a distance from each other on the same spirally curved line, or as shown in FIG. 8, may be disposed at a distance from each other on a plurality of spirally curved lines.

Each organic emission layer 70 formed in each pixel Px may have various shapes, such as a rounded quadrangle, a circle, a triangle, a rhombus shape, and the like, and not limited to any specific shape. However, in FIG. 5 to FIG. 8, each pixel Px is formed in the shape of a quadrangle.

The intermediate pattern layer 60 according to the present exemplary embodiment includes a plurality of first patterns extended along every neighboring opening along a predetermined path. In this case, because the predetermined path of the plurality of openings is changed according to an alignment shape of the respective pixels Px, the first patterns may be extended along the same path.

Referring to FIG. 5, the intermediate pattern layer 60 includes a plurality of first patterns 60a extended in the second direction (i.e., y-axis direction) where the plurality of openings are located, and each first pattern 60a has a straight light shape and the respective first patterns 60a are parallel with each other along the first direction (x-axis direction). Further, the intermediate pattern layer 60 further includes a plurality of second patterns 60b connected to the first patterns 60a, but extended in the non-display area NDA in a direction that crosses the first pattern 60a.

Referring back to FIG. 2, the intermediate pattern layer 60, specifically, the first pattern 60a, is formed to cover lateral side walls 351 of the pixel defining layer 350 and a part of lateral upper portions of the pixel defining layer 350, neighboring the side walls 351. Further, each first pattern 60a includes a portion corresponding to portion A located to correspond to each pixel electrode 50, and the pixel electrode corresponding portions A have the same height H from the substrate 110.

In the present exemplary embodiment, the pixel electrodes 50 corresponding to portions A included in the intermediate pattern layers 60 formed in the respective pixel Px have the same height H. Thus, when the organic emission layers 70 are formed on the pixel electrode corresponding portions A, the uniformity of the thickness of the organic emission layers 70 can be remarkably improved.

In addition, when the respective pixels Px are arranged in a matrix format along the first and second directions, the intermediate pattern layer 60 may further include the second pattern 60b extended in the non-display area NDA while being connected to the first pattern 60a. In this case, because the organic emission layers 70 are formed on the first patterns 60a and the second patterns 60b extended while being connected to the first pattern 60a, the thickness can be more uniform.

In an exemplary embodiment of the present invention, the first pattern 60a and the second pattern 60b of the intermediate pattern layer 60, may be connected to form, for example, a ladder shape, as shown in FIG. 5. Specifically, the first patterns 60a, each having a predetermined width, form a plurality of straight line patterns extended in the second direction (y-axis direction) and arranged parallel to each other along the first direction (x-axis direction) that crosses the second direction.

The second patterns 60b are respectively connected to lateral ends of the first patterns 60a and extended in the first direction such that they form a ladder shape. In this case, the plurality of organic emission layers 70 disposed on the first patterns 60a emit light of the same color.

In an exemplary embodiment of the present invention, as shown in FIG. 6, the intermediate pattern layer 60 may further include third patterns 61b and fourth patterns 61bb, in addition to first and second patterns 61a and 60aa.

Specifically, the first patterns 61a and the third patterns 61b, each having a predetermined width, form a plurality of straight line patterns extended along a second direction (y-axis direction) and arranged parallel to each other in a first direction (x-axis direction), and the first patterns 61a and the third patterns 61b are alternately arranged.

In addition, the second patterns 61aa are connected to one end of the first patterns 61a and are extended in the first direction.

Further, the fourth patterns 61bb are connected to one end of the third patterns 61b, and are extended in the first direction in the non-display area NDA that is located opposite to the non-display area NDA where the second patterns 61aa are located.

In this case, the organic emission layer 70 disposed on the first pattern 61a and the organic emission layer 70 disposed on the third pattern 61b may emit light of different colors. Thus, as stated above, the organic light emitting diode display where the intermediate pattern layer 60 including the first to fourth patterns 61a to 61bb is formed may include organic emission layers 70 emitting light of at least two different colors.

In an exemplary embodiment of the present invention, as shown in FIG. 7, the intermediate layer 60 may include first patterns 62a, second patterns 62aa, third patterns 62b, fourth patterns 62bb, fifth patterns 62c, and sixth patterns 62cc.

Specifically, the first patterns 62a, the third patterns 62b, and the fifth patterns 62c form a plurality of straight line patterns, each having a predetermined width and extended along a second direction (y-axis direction) and the straight line patterns are arranged parallel to each other in a first direction (x-axis direction), and the first patterns 62a, the third patterns 62b, and the fifth patterns 62c are alternately arranged in sequence.

The second patterns 62aa are connected to one end of the first patterns 62a and are extended in the first direction.

The fourth patterns 62bb are connected to one end of the third patterns 62bb and are extended in the first direction in a non-display area NDA disposed opposite to a non-display area NDA where the second patterns 62aa are located.

The sixth patterns 62cc are formed in an area where the second patterns 62aa and the fourth patterns 62bb overlap each other, interposing an insulating layer 65 therebetween. In this case, the insulating layer 65 is formed with a small thickness in only a predetermined area where the second patterns 62aa and the fourth patterns 62bb overlap each other using a minute pattern mask and the like.

The sixth patterns 62cc are then respectively connected to lateral ends of the fifth patterns 62c, and are extended in the first direction so as to form a ladder shape having a large gap.

In this case, organic emission layers 70 are disposed on the first pattern 62a and the third patterns 62b, and the fifth patterns 62c emit light of different colors. Thus, as previous stated, the organic light emitting diode display, where the intermediate pattern layer 60, including the first to sixth patterns 61a to 62cc, is formed, may include the organic emission layers 70 emitting light of at least three different colors.

As described above, the organic light emitting diode display according to the present invention includes an intermediate pattern layer including a plurality of patterns extended along a plurality of openings. Thus, uniformity of the thickness of the organic light emission layers formed on the intermediate pattern layer can be significantly improved, and the same duration of time is consumed for drying each organic emission layer after forming the organ emission layers so that the organic light emitting diode display can have excellent luminance uniformity even though the organic emission layers are formed using an ink jet printing method.

In an exemplary embodiment of the present invention, a plurality of first patterns 63a of the intermediate pattern layer 60 may be spirally extended along a plurality of openings respectively separated from each other with a predetermined gap along a spiral path.

In this case, as shown in FIG. 8, the intermediate pattern layer 60 may further include seventh patterns 63b and ninth patterns 63c, in addition to the first patterns 63a in a display area DA, such that a plurality of spiral patterns may be formed.

Further, the first patterns 63a, the seventh patterns 63b, and the ninth patterns 639c may be disposed together with second patterns 63bb, eighth patterns 63bb, and tenth patterns 63cc connected with the first, seventh, and ninth patterns 63a, 63b, and 63c, and are extended in a non-display area NDA.

Organic emission layers 70 formed on the first patterns 63a are extended in a spiral having a predetermined width to emit light of the same color. However, the respective organic emission layers 70 formed on the first layers 63a, the seventh patterns 63b, and the ninth patterns 63c may emit light of different colors. Thus, as previously stated, the organic light emitting diode display where an intermediate pattern layer 60 including a plurality of spiral patterns such as the first patterns 63a, the seventh patterns 63b, and the ninth patterns 63c may include organic emission layers 70 emitting light of at least three different colors.

An organic light emitting diode display where the above-stated organic emission layers that are arranged in a spiral shape are formed can be applied to a wearable organic light emitting diode display in addition to the above-stated effect.

A method for manufacturing an organic light emitting diode display according to an exemplary embodiment of the present invention will be described.

Figure 9:
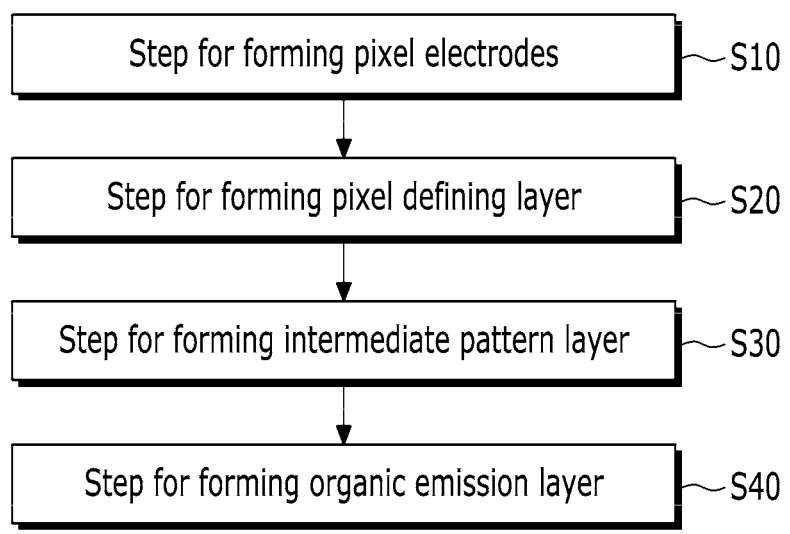
FIG. 9 illustrates a flowchart of a process in the manufacturing of the organic light emitting diode display according to an exemplary embodiment of the present invention.

FIG. 9 illustrates a process flowchart of a method of manufacturing an organic light emitting diode display according to an exemplary embodiment of the present invention.

Referring to FIG. 9, a method of manufacturing an organic light emitting diode display includes a step for forming a plurality of pixel electrodes (S10), a step for forming a pixel defining layer (S20), a step for forming an intermediate pattern layer (S30), and a step for forming an organic emission layer (S40).

First, pixel electrodes 50 are formed in a display area DA of a prepared substrate 110.

Referring to FIG. 2, a driving thin film transistor T2 is formed on a substrate 110, and then an organic insulating material or an inorganic insulating material is layered thereon and then patterned such that a planarization layer 124 having a plurality of contact holes is formed.

Next, a conductive material is layered on the planarization layer 124 and then the conductive material is patterned such that the pixel electrodes 50 are formed to respectively correspond to pixels Px.

In this case, the planarization layer 124 may be made of one or more materials of polyacrylates resin, epoxy resin, phenolic resin, polyamides resin, polyimide resin, unsaturated polyester resin, poly phenylenethers resin, poly phenylenesulfides resin, and benzocyclobutene (BCB).

A resin, such as a polyacrylate resin and a polyimide, a silica-based inorganic material, or the like is then layered on the pixel electrode 50 and the planarization layer 124, and then patterned along at least one of a straight line shape and a curved line shape to form a pixel defining layer 350 having a plurality of openings that respectively expose the pixel electrodes 50.

An intermediate pattern layer 60, including a plurality of first patterns extended along the alignment of the plurality of openings, is then patterned using a photolithography process on the substrate 110 where the pixel defining layer 350 is formed.

Specifically, in the present exemplary embodiment, a plurality of portions A of the first patterns, disposed to respectively correspond to the plurality of pixel electrodes 50, may have the same height H from the substrate 110.

The intermediate pattern layer 60 is patterned using a composition having a reaction group that can be crosslink-bonded by light or heat. The composition may include, for example, at least one of olefin, acrylate, methacrylate, and vinyl ether, but it is not limited thereto.

Further, the intermediate pattern layer 60 may be patterned to have a thickness that is less than or equal to 100 Å, more particularly, between about 10 Å to about 100 Å. When the thickness is not included in the above-stated range, hole transport may be influenced by the intermediate pattern layer 60 so that light emission efficiency of the organic light emitting diode display may be reduced. Thus, the thickness of the intermediate pattern layer 60 may be less than or equal to 100 Å.

In an exemplary embodiment of the present invention, the intermediate pattern layer 60 may be patterned to include second patterns extended in a non-display are NDA of the substrate 110 while being connected to the first patterns.

In this case, various shapes patterned in the intermediate pattern layer 60 have been described with reference to FIG. 5 to FIG. 8, and therefore, no further description will be provided.

Organic emission layers 70 may be formed on the patterned intermediate pattern layer 60 using an ink-jet printing process.

Figure 10A:
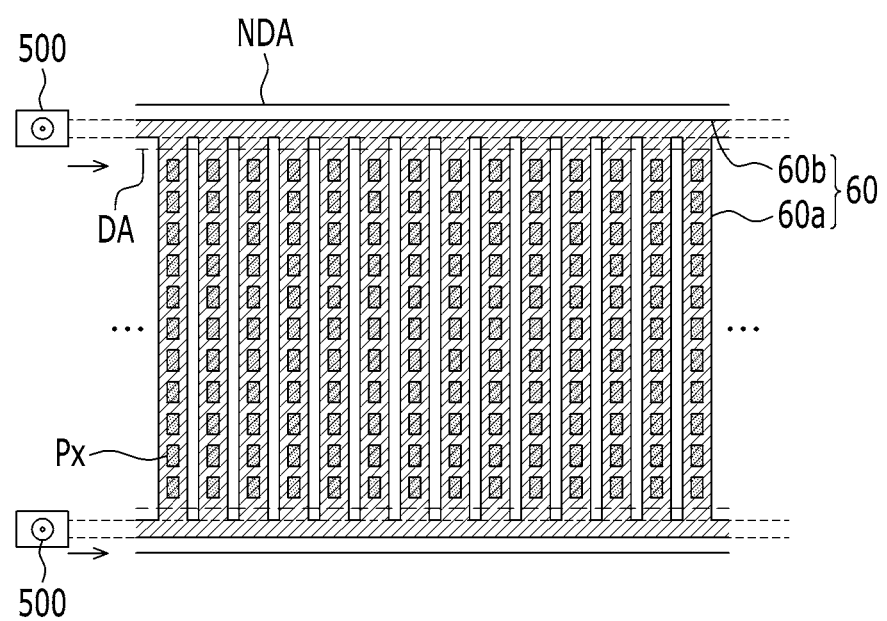
FIG. 10A and FIG. 10B illustrate a method of manufacturing the organic light emitting diode display according to an exemplary embodiment of the present invention.
Figure 10B:
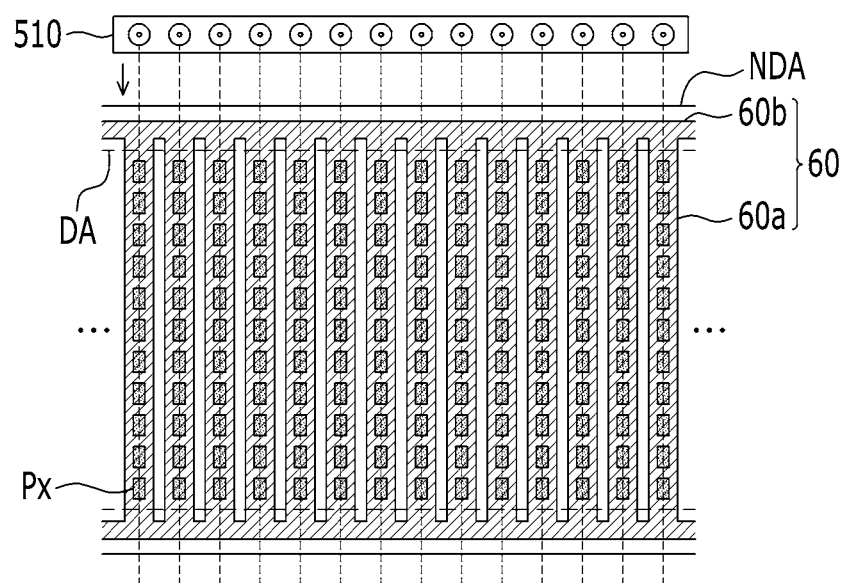

FIG. 10A and FIG. 10B illustrate an exemplary embodiment for forming the organic emission layer 70.

First, ink-jet heads 500 are respectively disposed on the top and the bottom of the left side of a substrate, as shown in FIG. 10A, and an organic emission layer forming material is sprayed on second patterns 60b along the arrow direction on the intermediate pattern layer 60 that has been patterned with the shape, as shown in FIG. 5.

As shown in FIG. 10B, the ink-jet head 510 disposed with nozzles that are arranged with an equivalent interval from the center of the first direction (x-axis direction) of each pixel is then prepared in an upper end of the substrate, and the organic emission layer forming material is sprayed on the first patterns 60a along the arrow direction so as to be connected with the organic emission layer forming material sprayed on the second patterns 60b disposed in the upper and lower non-display areas NDA of the substrate.

In this case, because the organic emission layer forming materials sprayed on the intermediate pattern layer 60 of the display area DA and the non-display area NDA are connected into one, and are thereby extended, organic emission layers formed in the respective pixel Px of the organic light emitting diode display formed with such a sequence emit light of the same color.

Next, FIGS. 11A, 11B, 11C and 11D illustrate another exemplary embodiment for forming the organic emission layer 70.

Figure 11A:
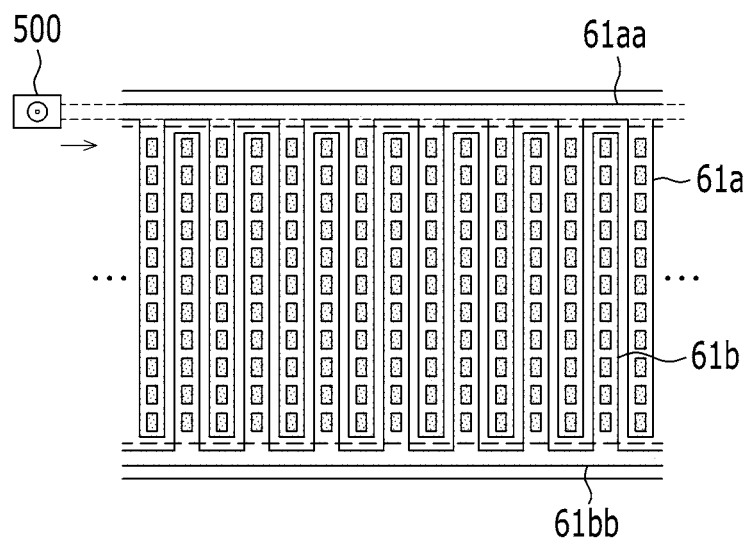
FIG. 11A, FIG. 11B, FIG. 11C, and FIG. 11D illustrate a method of manufacturing the organic light emitting diode display according to another exemplary embodiment of the present invention.

First, as shown in FIG. 11A, an inkjet head 500 is disposed in an upper left end of the substrate, and an organic emission layer forming material is sprayed on a second pattern 61aa of a non-display area along the arrow direction on an intermediate pattern layer 600 patterned with the shape shown in FIG. 6.

Figure 11B:
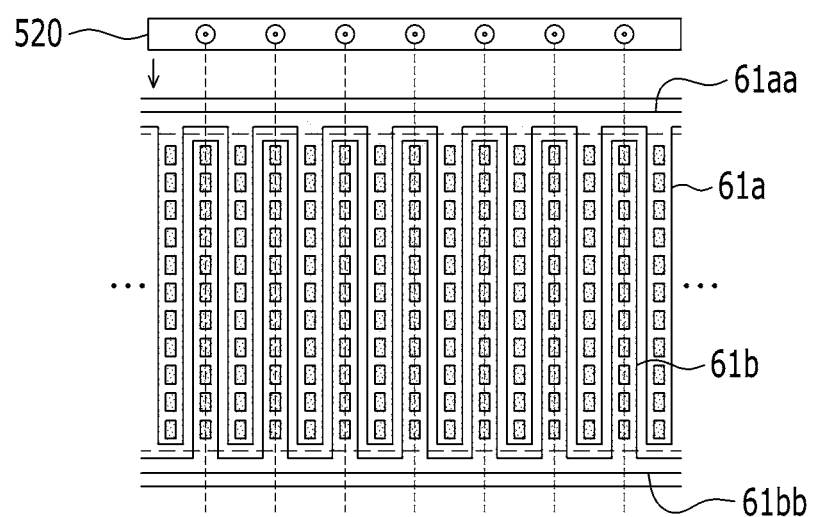

As shown in FIG. 11B, an inkjet head 520 disposed with nozzles that are arranged in the same interval as the first direction (x-axis direction) center of a pixel area that is located overlapping a first pattern 61a is then prepared in an upper end of the substrate, and an organic emission layer forming material is sprayed on the first pattern 61a along the array direction so as to be connected with the organic emission layer forming material sprayed on the second pattern 61aa.

Figure 11C:
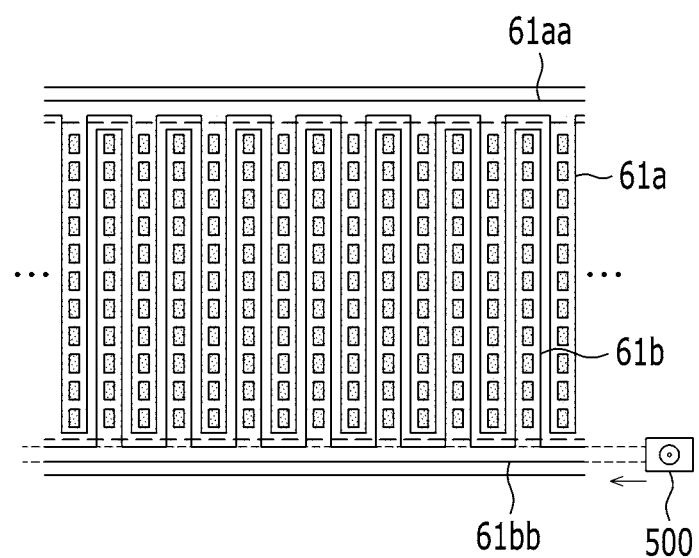

As shown in FIG. 11C, the inkjet head 500 is disposed in a lower right end of the substrate, and an organic emission layer forming material is then sprayed on a fourth pattern 61bb on the non-display area along the arrow direction.

Figure 11D:
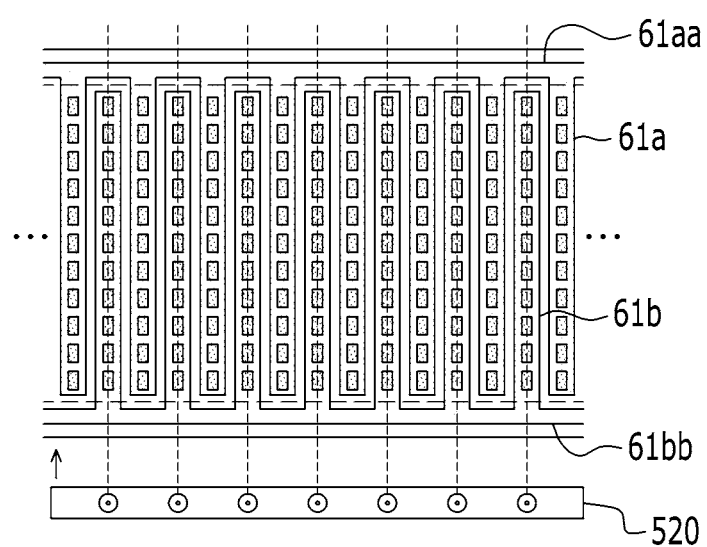

As shown in FIG. 11D, an inkjet head 520 disposed with nozzles that are arranged in the same interval as the first direction (x-axis direction) center of a pixel area that is located overlapping a third pattern 61b is THEN prepared in a lower end of the substrate and an organic emission layer forming material is sprayed on the third pattern 61b along the array direction so as to be connected with the organic emission layer forming material sprayed on the fourth pattern bb.

Thus, in the method of manufacturing the present exemplary embodiment, two patterns are separately patterned in the intermediate patterns layers connected as one throughout the display area and the non-display area so that the organic emission layers, respectively emitting different colors, can be easily formed.

Although a method of manufacturing is additionally illustrated, organic emission layer forming material emitting one color may be formed on a first pattern 62a and a second pattern 62aa and an organic emission layer forming material emitting light of another color may be formed on a third pattern 62b and a fourth pattern 62bb using the same method of FIGS. 11A to 11D on a substrate 110 where an intermediate pattern layer 60 is patterned with the same shape of FIG. 7, and an organic emission layer forming material emitting light of another color may be formed on a fifth pattern 62c and a sixth pattern 62cc using the same method of FIGS. 10A and 10B.

When the organic emission layer 70 is formed using the method of manufacturing the exemplary embodiment of the present invention, an organic emission layer forming material sprayed on a pattern of the intermediate pattern layer 60 of the non-display area NDA is connected with an organic emission layer forming material sprayed on a pattern of the intermediate pattern layer 60 of the display area DA such that the thickness can be uniform, and accordingly, each pixel area Px has the same height in the organic emission layer 70, thereby significantly improving luminance uniformity.

The organic emission layers 70 of the respective pixel Px have a uniform height without minutely adjusting the amount of nozzles of the inkjet head, and a spray process can be performed with rapid speed, and accordingly, a deterioration problem in surface properties of the organic emission layers due to a non-uniform drying process can be easily solved.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting diode display comprising:
   a plurality of pixel electrodes disposed on a substrate;
   a pixel defining layer disposed on the pixel electrodes and comprising a plurality of openings respectively exposing the pixel electrodes;
   a plurality of organic emission layers respectively disposed on the pixel electrodes; and
   intermediate pattern layers respectively disposed between the pixel electrodes and the organic emission layers,
   wherein the intermediate pattern layers comprise a plurality of first patterns that are extended while being respectively connected along the openings neighboring along a predetermined path.

2. The organic light emitting diode display of claim 1, wherein the first patterns comprise a plurality of portions that respectively correspond to the pixel electrodes, and the plurality of corresponding pixel electrode portions respectively have the same height from the substrate.

3. The organic light emitting diode display of claim 1, wherein:
   the substrate comprises a display area configured to display an image, and a non-display area neighboring the display area;
   the pixel electrodes are disposed in the display area; and
   the intermediate pattern layers further comprise second patterns that are extended while being connected to the first patterns in the non-display area.

4. The organic light emitting diode display of claim 3, wherein the first patterns of the intermediate pattern layer comprise a plurality of straight line patterns extended in a second direction that are arranged parallel to each other along a first direction that crosses the second direction, and the second patterns of the intermediate pattern layer are respectively extended in the first direction while being connected to ends of the respective first patterns.

5. The organic light emitting diode display of claim 4, wherein a plurality of organic emission layers disposed on the first patterns of the intermediate layer emit light of the same color.

6. The organic light emitting diode display of claim 3, wherein:
   the second patterns of the intermediate pattern layer are connected to one end of the first patterns and are extended in the first direction; and
   the intermediate pattern layer further comprises:
      a plurality of third patterns including a plurality of straight light patterns alternately disposed with the first patterns, while being extended along the second direction and arranged parallel to each other along the first direction; and
      a plurality of fourth patterns connected to one end of the respective third patterns and extended in the first direction in the non-display area disposed opposite the second patterns.

7. The organic light emitting diode display of claim 6, wherein the organic emission layers disposed on the first patterns and the organic emission layers disposed on the third patterns emit light having different colors.

8. The organic light emitting diode display of claim 1, wherein the openings are formed with a predetermined gap along a spiral-type path, and the first patterns of the intermediate pattern layer are extended by being spirally connected along the openings.

9. The organic light emitting diode display of claim 1, wherein the organic emission layers further comprise a plurality of auxiliary organic layers disposed in lower portions that are adjacent to the pixel electrodes.

10. The organic light emitting diode display of claim 9, wherein the intermediate pattern layers are disposed between the pixel electrodes and the auxiliary organic layers.

11. The organic light emitting diode display of claim 9, wherein the intermediate pattern layer is disposed between the auxiliary organic layers and the organic emission layers.

12. The organic light emitting diode display of claim 9, wherein:
    the auxiliary organic layers are respectively comprise a multi-layered structure; and
    the intermediate pattern layer is disposed between the layers comprising the multi-layered structure.

13. A method of manufacturing an organic light emitting diode display, comprising:
    forming a plurality of pixel electrodes on a substrate;
    forming a pixel defining layer on the plurality of pixel electrodes, the pixel defining layer comprising a plurality of openings that respectively expose the pixel electrodes;
    forming an intermediate pattern layer on a substrate where the pixel defining layers are formed using a photolithography process, the intermediate pattern layer comprising a plurality of first patterns that are extended while being connected along the openings that neighbor each other along a predetermined path; and
    forming a plurality of organic emission layers on the first patterns using an inkjet printing method,
    wherein the forming of the intermediate pattern layer is performed to make the respective corresponding pixel electrode portions of the first patterns, disposed to respectively correspond to the pixel electrodes, have the same height.

14. The method of claim 13, wherein the forming of the intermediate pattern layer is performed further comprises forming a plurality of second patterns that are extended while being connected with the first patterns in a non-display area that neighbors a display area where the pixel electrodes are located.

15. The method of claim 14, wherein the forming of the organic emission layer further comprises forming an organic emission layer forming material on the second patterns and then forming an organic emission layer forming material that is to be extended while being connected with the second patterns on the first patterns.

* * * * *